US008130305B2

(12) United States Patent
Kuriyama

(10) Patent No.: US 8,130,305 B2
(45) Date of Patent: Mar. 6, 2012

(54) SOLID-STATE IMAGE SENSING DEVICE AND METHOD FOR FABRICATING THE SAME

(75) Inventor: Toshihiro Kuriyama, Shiga (JP)

(73) Assignee: Panasonic Corporation, Osaka (JP)

( * ) Notice: Subject to any disclaimer, the term of this patent is extended or adjusted under 35 U.S.C. 154(b) by 461 days.

(21) Appl. No.: 12/496,102

(22) Filed: Jul. 1, 2009

(65) Prior Publication Data
US 2010/0020219 A1 Jan. 28, 2010

(30) Foreign Application Priority Data
Jul. 28, 2008 (JP) ................................ 2008-193938

(51) Int. Cl.
H04N 3/14 (2006.01)
H04N 5/335 (2006.01)
(52) U.S. Cl. ...................................... 348/311; 257/215
(58) Field of Classification Search .................. 348/294, 348/302, 311; 257/215
See application file for complete search history.

(56) References Cited

U.S. PATENT DOCUMENTS
2004/0233314 A1* 11/2004 Kuriyama ..................... 348/311
2004/0259293 A1* 12/2004 Yamada ........................ 257/215

FOREIGN PATENT DOCUMENTS
| JP | 04-207076 | 7/1992 |
| JP | 08-088344 | 4/1996 |
| JP | 3270254 | 1/2002 |

\* cited by examiner

Primary Examiner — Gevell Selby
(74) Attorney, Agent, or Firm — McDermott Will & Emery LLP

(57) ABSTRACT

A solid-state image sensing device includes: a plurality of light receiving elements arranged in a matrix in a device formation region surrounded by a device isolation region of a semiconductor substrate; a plurality of vertical transfer sections for transferring charges of the light receiving elements in the column direction; and a horizontal transfer section for receiving the charges from the vertical transfer sections and for transferring the received charges in the row direction. The horizontal transfer section includes: a horizontal channel region; and a plurality of horizontal transfer electrodes extending over the horizontal channel region and the device isolation region and being spaced apart from each other. The distance between the horizontal transfer electrodes is larger at a boundary between the device formation region and the device isolation region than in the middle of the horizontal channel region.

11 Claims, 7 Drawing Sheets

SOLID-STATE IMAGE SENSING DEVICE AND METHOD FOR FABRICATING THE SAME

CROSS-REFERENCE TO RELATED APPLICATION

This application claims priority from Japanese Patent Application No. 2008-193938 filed on Jul. 28, 2008, which is hereby incorporated by reference in its entirety for all purposes.

BACKGROUND OF THE INVENTION

The present disclosure relates to a solid-state image sensing device and a method for fabricating the same, and specifically to a Charge Coupled Device (CCD) type solid-state image sensing device of and a method for fabricating the same.

DESCRIPTION OF THE PRIOR ART

In recent years, solid-state image sensing devices are in increasing demand as image sensing devices in digital still cameras and digital video cameras. Moreover, in mobile terminal equipment represented by mobile phones, the number of types of devices having a camera function is increasing. The solid-state image sensing devices are in increasing demand also as image sensing devices in such mobile terminal equipment.

For digital still cameras, digital video cameras, mobile terminal equipment, and the like, enhancement of image quality is demanded, so that the number of pixels of the solid-state image sensing devices tends to be increased year after year. Meanwhile, downsizing is also required, so that it is necessary to further miniaturize the solid-state image sensing devices.

A CCD type solid-state image sensing device generally adopts a two-layer electrode resulting from overlap of adjacent electrodes. It is easy in the two-layer electrode to reduce the distance between the electrodes, which can increase the charge transfer efficiency. However, the two-layer electrode needs an insulating film for insulation between the electrodes. This insulating film is generally formed by thermal oxidation. Therefore, the thermal oxidation for forming the insulating film expands an impurity diffusion layer of a transfer channel, so that the two-layer electrode is disadvantageous for miniaturization. Moreover, the overlap of the electrodes also has the problem of increasing the thickness of the solid-state image sensing device.

Therefore, it is attempted to form a transfer electrode as a single-layer electrode in which electrodes are not overlapped with each other but spaced apart from each other. In the single-layer electrode, it is required to reduce the distance between the electrodes in order to increase the transfer efficiency. Enhancement of image quality in recent years considerably increases the number of transfer stages. Therefore, the distance between the electrodes has to be 100 nm or less, and is required to be reduced to 50 nm or less in order to further improve performance. However, it is very difficult for normal photolithography to reduce the distance between the electrodes to less than 100 nm. As a method for reducing the distance between electrodes to less than the limit of normal photolithography, the method of using sidewalls is known as below (see, for example, Japanese Unexamined Patent Publication No. H04-207076).

First, on a polysilicon film or the like, a mask pattern having openings is formed by photolithography. Next, on the mask pattern, an oxide film, for example, is formed, and then anisotropically etched. As a result, sidewalls made of the oxide film are formed on side faces of the openings. The polysilicon film is etched using the mask pattern having the sidewalls, thereby polysilicon electrodes can be formed, with the distance between the polysilicon electrodes being smaller than the limit of photolithography. This can increase the transfer efficiency of a CCD type solid-state image sensing device including a single-layer electrode.

SUMMARY OF THE INVENTION

However, a CCD type solid-state image sensing device adopting the conventional single-layer electrode has the problem as follows. A horizontal bus line for supplying horizontal transfer electrodes with a control signal is generally formed over a device isolation region. This is for downsizing the solid-state image sensing device and reducing capacitance between a substrate and the horizontal transfer electrodes to reduce electric power consumption. For this reason, it is required to form the horizontal transfer electrodes to extend over a device formation region and the device isolation region.

In the solid-state image sensing device, the device isolation region generally has a Local Oxidation of Silicon (LOCOS) structure. Since a LOCOS oxide film has a thickness of several hundreds of nanometers, the device isolation region protrudes at least about 100 nm compared with the device formation region. As a result, a level-difference portion is formed at a boundary between the device formation region and the device isolation region.

The thickness of a polysilicon film for forming the horizontal transfer electrodes effectively increases at the level-difference portion. Therefore, at the boundary between the device formation region and the device isolation region where the level-difference portion is formed, underetching of the polysilicon film may occur, which remarkably increases the possibility that a short is caused between the horizontal transfer electrodes. If the amount of overetching is increased to avoid underetching, etching advances at other portions than the level-difference portion, thereby varying the distance between the horizontal transfer electrodes.

Moreover, when sidewalls are used to reduce the distance between the horizontal transfer electrodes to less than the limit of photolithography, the thickness of a hard mask for forming the sidewalls is also varied at the level-difference portion. This further increases variation in underetching or distance.

An example solid-state image sensing device of the present application may be capable of solving the problems discussed above, less likely cause a short between horizontal transfer electrodes, and have an increased charge transfer efficiency.

An example solid-state image sensing device includes: a plurality of light receiving elements arranged in a matrix in a device formation region surrounded by a device isolation region of a semiconductor substrate; a plurality of vertical transfer sections for transferring charges of the light receiving elements in a column direction; and a horizontal transfer section for receiving the charges from the vertical transfer sections and for transferring the received charges in a row direction. The horizontal transfer section has a horizontal channel region and a plurality of horizontal transfer electrodes extending over the horizontal channel region and the device isolation region and being spaced apart from each other. The distance between the horizontal transfer electrodes is larger at a boundary between the device formation region and the device isolation region than in the middle of the horizontal channel region.

In the example solid-state image sensing device, it is not necessary to form a miniaturized gap at the boundary between the device formation region and the device isolation region where a level difference is to be generated. Therefore, a short between the horizontal electrodes caused by underetching can be prevented. Moreover, the distance is small in the middle of the horizontal channel region, so that charge transfer efficiency is not reduced.

A method for fabricating the example solid-state image sensing device includes: (a) forming a horizontal channel region in a device formation region surrounded by a device isolation region of a semiconductor substrate; (b) forming a conductive film extending over the horizontal channel region and the device isolation region; (c) forming a first mask having openings on the conductive film, the openings extending in a direction crossing the horizontal channel region, and a width of the openings being larger at a boundary between the device formation region and the device isolation region than in the middle of the horizontal channel region; and (e) removing portions of the conductive film exposed in the openings to form a plurality of horizontal transfer electrodes, a distance between the horizontal transfer electrodes being larger at the boundary between the device formation region and the device isolation region than in the middle of the horizontal channel region.

With the method for fabricating the example solid-state image sensing device, it is possible to easily realize the distance between the horizontal transfer electrodes which is larger at the boundary between the device formation region and the device isolation region than in the middle of the horizontal channel region. Therefore, a solid-state image sensing device can be realized which less likely causes a short between horizontal transfer electrodes and has an increased charge transfer efficiency.

BRIEF DESCRIPTION OF THE DRAWINGS

FIGS. 2A and 2B illustrate the example solid-state image sensing device, wherein FIG. 2A is a cross section along line IIa-IIa of FIG. 1, and FIG. 2B is a cross section along line IIb-IIb of FIG. 1.

FIGS. 3A and 3B illustrate a process in a method for fabricating the example solid-state image sensing device, wherein FIG. 3A is a cross section along line IIIa-IIIa of FIG. 1, and FIG. 3B is a cross section along line IIIb-IIIb of FIG. 1.

FIGS. 4A and 4B illustrate a process in the method for fabricating the example solid-state image sensing device, wherein FIG. 4A is a cross section along line IIIa-IIIa of FIG. 1, and FIG. 4B is a cross section along line IIIb-IIIb of FIG. 1.

FIGS. 5A and 5B illustrate a process in the method for fabricating the solid-state image sensing device, wherein FIG. 5A is cross section along line IIIa-IIIa of FIG. 1, and FIG. 5B is a cross section along line IIIb-IIIb of FIG. 1.

FIGS. 6A and 6B illustrate a process of a variation of the method for fabricating the example solid-state image sensing device, wherein FIG. 6A is a cross section along line IIIa-IIIa of FIG. 1, and FIG. 6B is a cross section along line IIIb-IIIb of FIG. 1.

FIGS. 7A and 7B illustrate a process of the variation of the method for fabricating the example solid-state image sensing device, wherein FIG. 7A is a cross section along line IIIa-IIIa of FIG. 1, and FIG. 7B is a cross section along line IIIb-IIIb of FIG. 1.

FIGS. 8A and 8B illustrate a process of the variation of the method for fabricating the example solid-state image sensing device, wherein FIG. 8A is a cross section along line IIIa-IIIa of FIG. 1, and FIG. 8B is a cross section along line IIIb-IIIb of FIG. 1.

FIGS. 9A and 9B illustrate a process of the variation of the method for fabricating the example solid-state image sensing device, wherein FIG. 9A is a cross section along line IIIa-IIIa of FIG. 1, and FIG. 9B is a cross section along line IIIb-IIIb of FIG. 1.

FIGS. 10A and 10B illustrate a process of the variation of the method for fabricating the example solid-state image sensing device, wherein FIG. 10A is a cross section along line IIIa-IIIa of FIG. 1, and FIG. 10B is a cross section along line IIIb-IIIb of FIG. 1.

DETAILED DESCRIPTION

Figure 1:
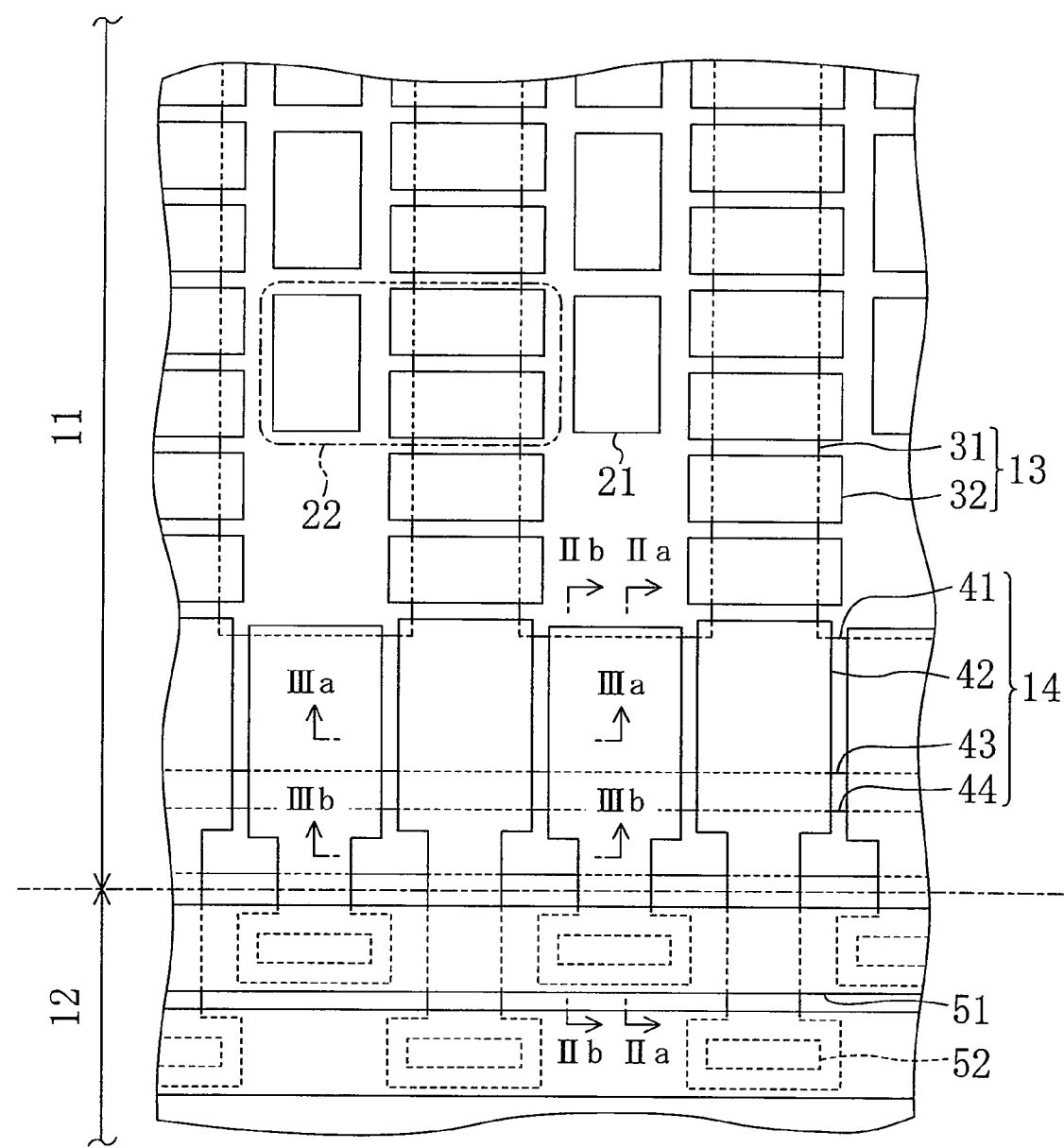
FIG. 1 is a plan view showing an example solid-state image sensing device.

FIG. 1 shows a plan configuration of an example solid-state image sensing device. As shown in FIG. 1, the example solid-state image sensing device is a Charge Coupled Device (CCD) type solid-state image sensing device. The solid-state image sensing device includes: a plurality of light receiving elements 21 arranged in a matrix with rows and columns; vertical transfer sections 13 for transferring charges of the light receiving elements 21 in the column direction; and a horizontal transfer section 14 for transferring the charges transferred by the vertical transfer sections in the row direction.

The light receiving elements 21 are photodiodes formed in a device formation region 11 surrounded by a device isolation region 12, and accumulate charges according to the strength of received light.

The vertical transfer sections 13 include: vertical channel regions 31 serving as impurity diffusion layers extending in the column direction in regions between the light receiving elements 21; and vertical transfer electrodes 32 spaced apart from each other over the vertical channel regions 31. The vertical transfer sections 13 transfer signal charges read from the light receiving elements 21 in the vertical direction (i.e., the column direction).

The horizontal transfer section 14 includes: a horizontal channel region 41 which is connected to ends of the vertical channel regions 31 and serves as an impurity diffusion layer extending in the row direction; and horizontal transfer electrodes 42 spaced apart from each other over the horizontal channel region 41. The horizontal transfer section 14 receives the charges transferred by the vertical transfer sections 13 in the vertical direction, and transfers the received charges in the horizontal direction (i.e., the row direction).

Adjacently to the horizontal channel region 41, a horizontal barrier region 43 is formed which passes redundant charges from the horizontal channel region 41. Adjacently to the horizontal barrier region 43, a horizontal drain region 44 is formed which discharges the charges passed through the horizontal barrier region. Generally, the horizontal channel region 41 has a channel width of about 40 μm to 60 μm, the horizontal barrier region 43 has a width of about 1 μm to 3 μm, and the horizontal drain region has a width of 5 μm to 10 μm.

The horizontal transfer electrodes 42 extend over the horizontal channel region 41 and the device isolation region 12. Over the device isolation region 12, the horizontal transfer electrodes 42 are connected to horizontal bus lines 51 via contacts 52. FIG. 1 shows an example in which two horizontal bus lines 51 are formed, and the horizontal transfer section 14 is driven by a two-phase signal. Generally, the horizontal bus lines 51 each have a width of 20 μm to 40 μm.

In the example solid-state image sensing device, the width of the horizontal transfer electrodes 42 changes at their portions formed over the horizontal drain region 44, wherein portions formed over a boundary between the device formation region 11 and the device isolation region 12 are narrower than portions formed over the horizontal channel region 41. Therefore, the distance between the horizontal transfer electrodes 42 is larger over the boundary between the device formation region 11 and the device isolation region 12 than over the horizontal channel region 41.

With this configuration, a short between the horizontal transfer electrodes 42 can be prevented, and the charge transfer efficiency of the horizontal transfer sections can be improved.

Figure 2A:
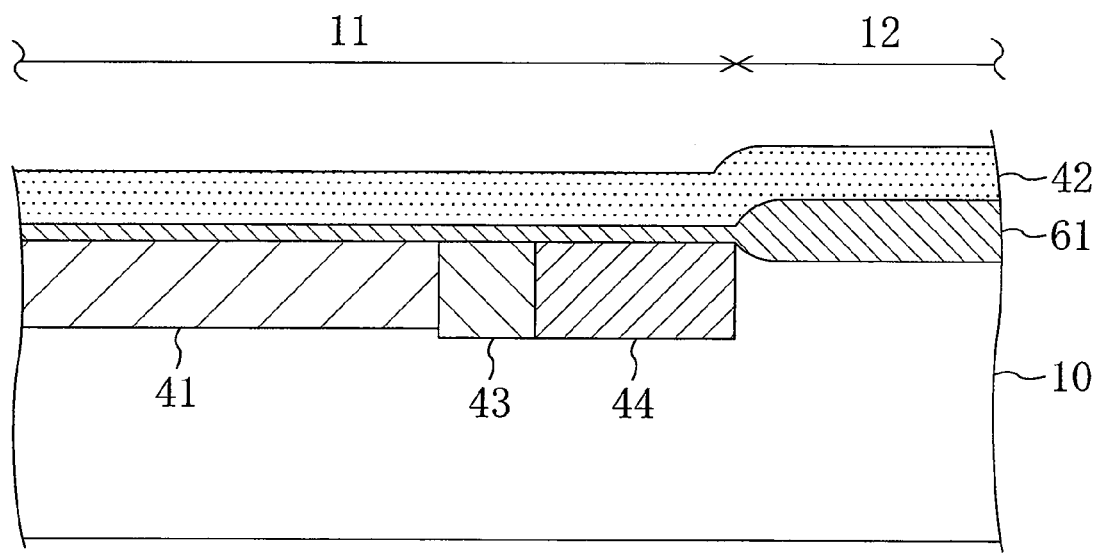
Figure 2B:
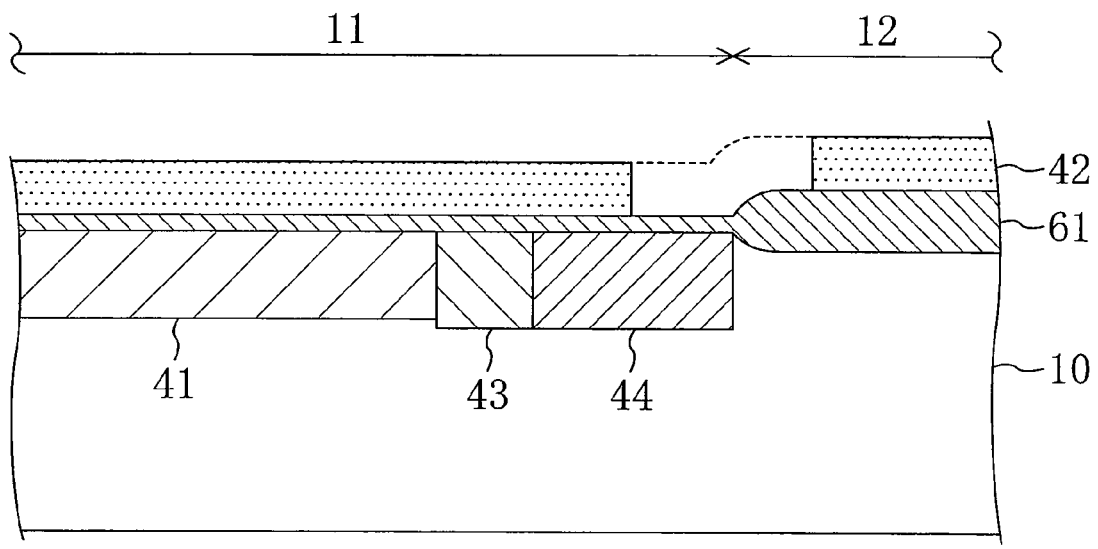

FIGS. 2A and 2B show cross-sectional configurations respectively along lines IIa-IIa and IIb-IIb of FIG. 1. As shown in FIGS. 2A and 2B, the device isolation region 12 has a Local Oxidation of Silicon (LOCOS) structure. Therefore, the thickness of an oxide film (e.g., a $SiO_2$ film) 61 formed on a substrate 10 is much larger over the device isolation region 12 than over the device formation region 11. The insulating film 61 formed over the device formation region 11 is a gate insulating film for the transfer electrodes, and has a thickness of several nanometers to several tens of nanometers. Meanwhile, over the device isolation region 12, the insulating film 61 has a thickness of about 200 nm to 600 nm and protrudes at least about 100 nm above the substrate 10 to form a level-difference portion.

Meanwhile, the distance between the horizontal transfer electrodes 42 has to be less than about 100 nm in consideration of the transfer efficiency. To meet increase in the number of pixels in recent years, the distance is required to be about 50 nm, and is also required to be further reduced to about 30 nm to 40 nm. Performing such microfabrication on a flat portion is possible, but it is almost impossible to perform the micromachining on the level-difference portion with the same accuracy as on the flat portion.

The horizontal transfer electrodes 42 are obtained by forming a polysilicon film extending over the device formation region 11 and the device isolation region 12, and then selectively etching the polysilicon film. The thickness of the polysilicon film is larger at the level-difference portion than at the flat portion. Moreover, also the thickness of a hard mask which is to be formed on the polysilicon film is large at the level-difference portion. Therefore, the portion having a large film thickness is insufficiently etched, and thus it is highly possible that underetching occurs. The occurrence of underetching may cause a short between the horizontal transfer electrodes 42. Moreover, overetching to avoid underetching may vary the distance between the horizontal transfer electrodes 42, thereby deteriorating the features of the solid-state image sensing device.

However, in the example solid-state image sensing device, the distance between the horizontal transfer electrodes 42 is larger least at the boundary between the device formation region 11 and the device isolation region 12 than in other parts of the device formation region 11 and the device isolation region 12. The boundary between the device formation region 11 and the device isolation region 12 mentioned here is a part where the thickness of the insulating film 61 changes to generate a level difference in the polysilicon film which is to be the horizontal transfer electrodes 42 formed on the insulating film 61. With this configuration, it is possible to suppress the occurrence of underetching. Meanwhile, over the horizontal channel region 41, the distance between the horizontal transfer electrodes 42 is small, which can improve the charge transfer efficiency. Moreover, with this configuration, capacitance between the horizontal transfer electrodes 42 (i.e., interphase capacitance) can be reduced, and the effect of reducing electric power consumption can be obtained.

As shown in FIG. 1, in the case where the vertical transfer sections are driven by a four-phase signal and the horizontal transfer section is driven by a two-phase signal, the lateral width of a region 22 occupied by one light receiving element 21 and corresponding two vertical transfer electrodes 32 substantially equals the lateral width of two horizontal transfer electrodes 42. In the present solid-state image sensing device, the region 22 is a square of about 1.5 μm and is studied to be reduced to a square of about 1.2 μm to 1.0 μm.

For example, in the case where the region 22 is a square of 1.5 μm, the width of each of the horizontal transfer electrodes 42 is 700 nm, and the distance between the horizontal transfer electrodes 42 is 50 nm over the horizontal channel region 41, thereby sufficient charge transfer efficiency can be ensured. In this case, over the boundary between the device formation region 11 and the device isolation region 12, the width of each of the horizontal transfer electrodes 42 may be 550 nm, and the distance between the horizontal transfer electrodes 42 may be 200 nm. If the distance between the horizontal transfer electrodes 42 is about 200 nm, the occurrence of underetching is satisfactorily avoided even if the level difference is about 100 nm.

The interphase capacitance of the horizontal transfer electrodes 42 is determined by the distance between the horizontal transfer electrodes 42, wherein the larger the distance between the horizontal transfer electrodes 42 is, the smaller the interphase capacitance is. It is provided that the width of the horizontal channel region is about 50 μm and that the width of two horizontal bus lines is about 50 μm. In this case, the distance between approximately one-half portions of the horizontal transfer electrodes 42 is 50 nm, and the distance between the remaining one-half portions of the horizontal transfer electrodes 42 is four times as large as the above distance, that is, 200 nm. Therefore, the interphase capacitance is about 60 to 70 percent of that in the case where the whole portions of the horizontal transfer electrodes 42 are spaced 50 nm apart from each other. As described above, reducing the interphase capacitance can reduce the electric power consumption.

Hereinafter, a method for fabricating the example solid-state image sensing device will be described with reference to the drawings. FIGS. 3A to 5A and FIGS. 3B to 5B illustrate a method for fabricating a horizontal electrode portion of the example solid-state image sensing device in the order of fabrication. FIGS. 3A to 5A show cross sections along line IIIa-IIIa of FIG. 1, and FIGS. 3B to 5B show cross sections along line IIIb-IIIb of FIG. 1.

Figure 3A:
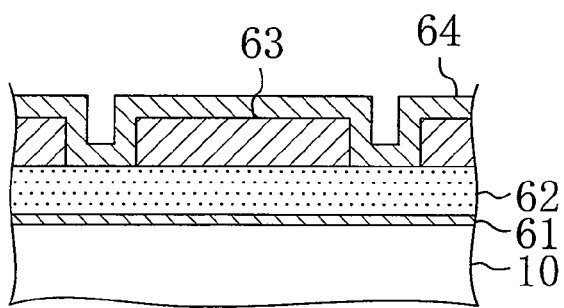
Figure 3B:
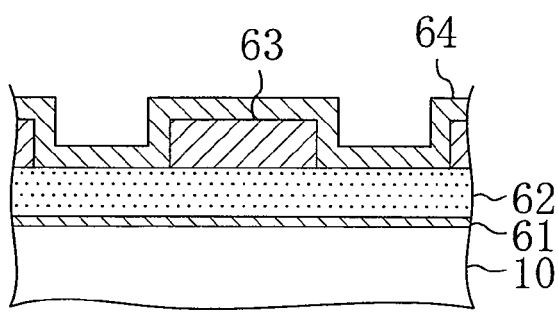

First, as illustrated with FIGS. 3A and 3B, over a substrate 10 made of silicon, an insulating film 61 having a thickness of 40 nm and made of $SiO_2$, and a polysilicon film 62 having a thickness of 150 nm are formed. Subsequently, on the polysilicon film 62, a $Sio_2$ film having a thickness of 100 nm is formed, and then patterned by photolithography and etching to form a first mask 63 having openings. The width of the openings is 150 nm in a region over the horizontal channel region 41 and 300 nm in a region over the boundary between the device formation region 11 and the device isolation region 12. Subsequently, over the first mask 63, a SiO₂ film 64 having a thickness of 60 nm is formed.

Figure 4A:
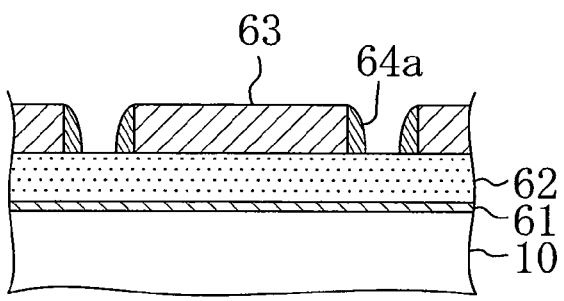
Figure 4B:
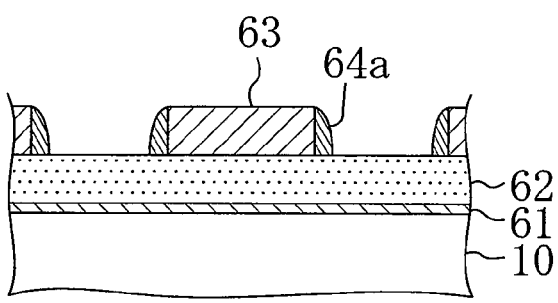

Next, as illustrated with FIGS. 4A and 4B, anisotropic etching is performed to remove the SiO₂ film 64 by its thickness for forming sidewalls 64a on side faces of the openings of the first mask 63. As a result, the width of the openings with the sidewalls 64a formed therein is 50 nm in the region over the horizontal channel region 41 and 200 nm in the region over the boundary between the device formation region 11 and the device isolation region 12.

Figure 5A:
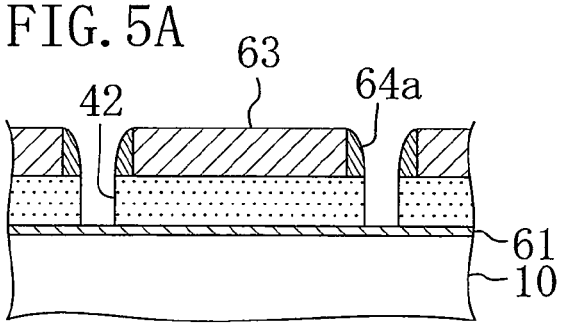
Figure 5B:
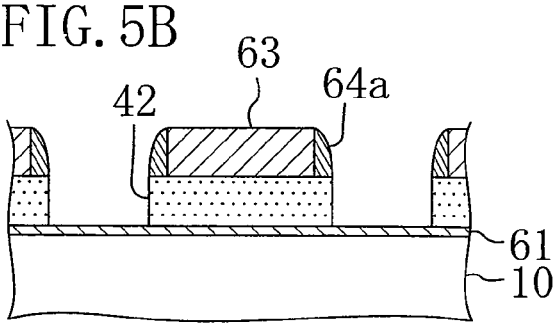

Next, as illustrated with FIGS. 5A and 5B, the polysilicon film 62 is etched using the first mask 63 and the sidewalls 64a as a mask. As a result, a plurality of horizontal transfer electrodes 42 is obtained, wherein the distance between the horizontal transfer electrodes 42 is 50 nm in the region over the horizontal channel region 41 and 200 nm in the region over the boundary between the device formation region 11 and the device isolation region 12. In this way, it is possible to use processes about the same as those for a conventional solid-state image sensing device having a constant distance between horizontal transfer electrodes.

Figure 6A:
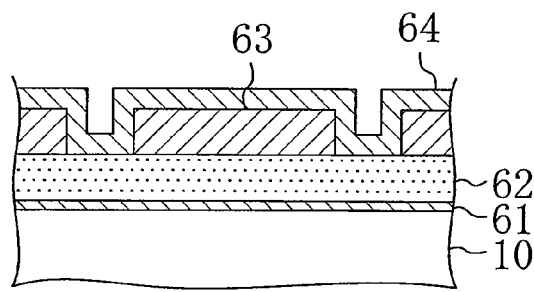
Figure 6B:
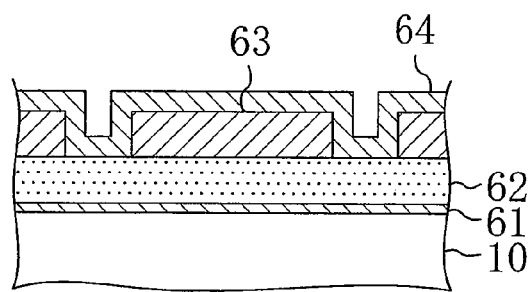

Alternatively, the horizontal transfer electrodes can be formed by the method as follows. First, as illustrated with FIGS. 6A and 6B, over a substrate 10, an insulating film 61 and a polysilicon film 62 are formed, a first mask 63 is patterned, and then a SiO₂ film 64 is formed. It should be noted that the first mask 63 is formed to have first openings having a constant with of 150 nm.

Figure 7A:
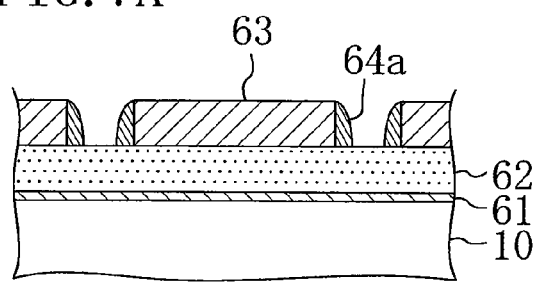
Figure 7B:
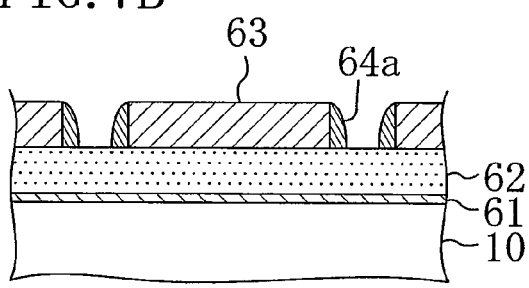

Next, as illustrated with FIGS. 7A and 7B, the SiO₂ film 64 is anisotropically etched to form sidewalls 64a.

Figure 8A:
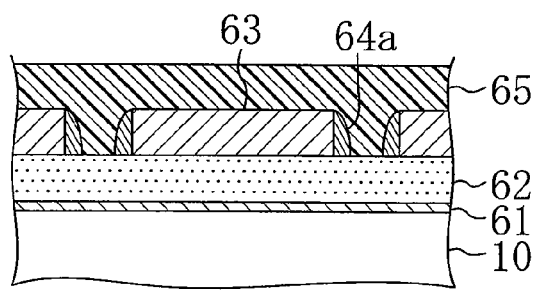
Figure 8B:
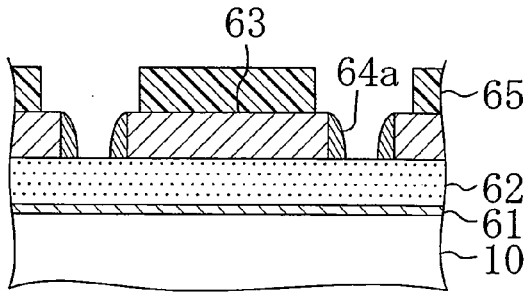

Next, as illustrated with FIGS. 8A and 8B, over the first mask 63, a photoresist film is formed, and then patterned to form a second mask 65 having second openings only in a region over the boundary between the device formation region 11 and the device isolation region 12. It is provided that the width of the second openings is 200 mm.

Figure 9A:
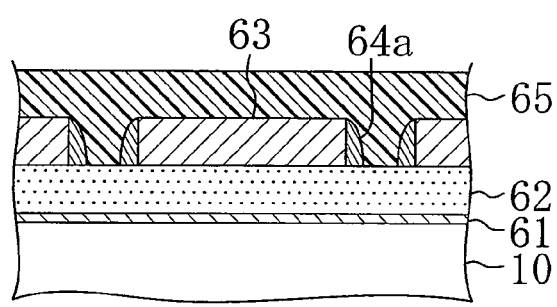
Figure 9B:
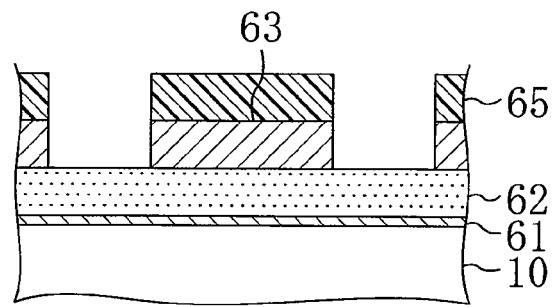

Next, as illustrated with FIGS. 9A and 9B, the first mask 63 and the sidewalls 64a are etched using the second mask 65 in the region over the boundary between the device formation region 11 and the device isolation region 12 to increase the width of the first openings.

Figure 10A:
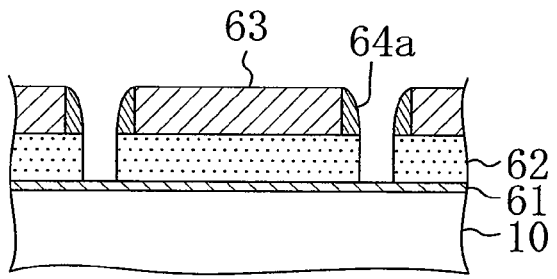
Figure 10B:
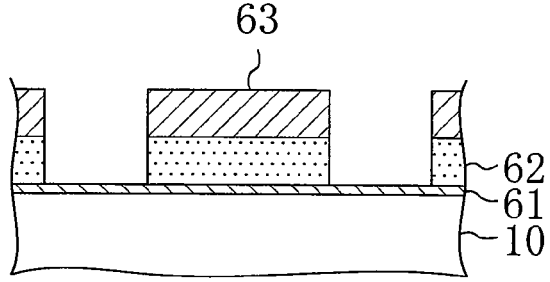

Next, as illustrated with FIGS. 10A and 10B, the polysilicon film 62 is etched using the first mask 63. As a result, a plurality of horizontal transfer electrodes 42 is obtained, wherein the distance between the horizontal transfer electrodes 42 is 50 nm in a region over the horizontal channel region 41 and 200 nm in the region over the boundary between the device formation region 11 and the device isolation region 12.

When sidewalls are respectively formed on side faces of a wide opening and side faces of a narrow opening, the sidewalls in the wide opening are smaller than those in the narrow opening. Therefore, if the processes as illustrated with FIGS. 3A to 5A and FIGS. 3B to 5B are used, the distance between the horizontal transfer electrodes 42 may vary. With the processes as illustrated with FIGS. 6A to 10A and FIGS. 6B to 10B, the horizontal transfer electrode 42 with almost no variation in distance can be formed.

Figure 11:
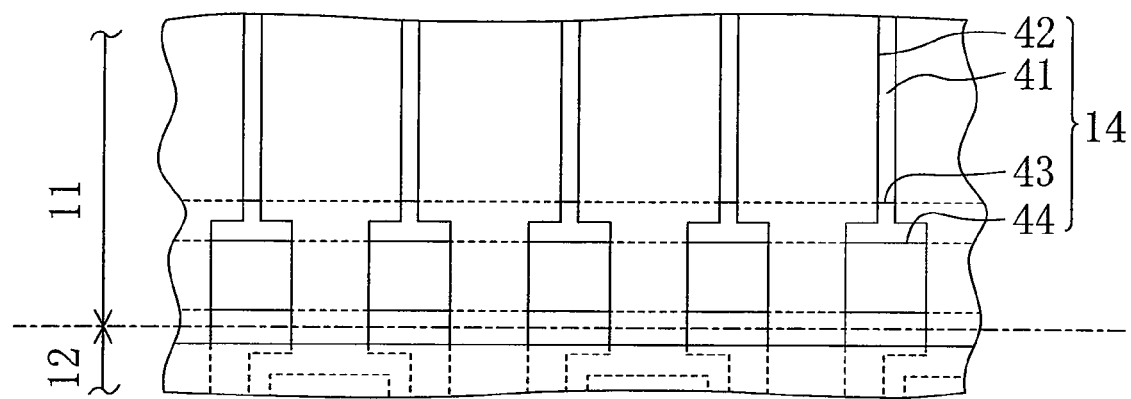
FIG. 11 is a plan view showing a variation of the example solid-state image sensing device.

In the present embodiment, the width of the horizontal transfer electrodes 42 is changed over the horizontal drain region 44. However, it may be required only that the distance between the horizontal transfer electrodes 42 is large at the boundary between the device formation region 11 and the device isolation region 12 where the level difference is to be generated. Therefore, as shown in FIG. 11, the width of the horizontal transfer electrodes 42 may be changed over the horizontal barrier region 43. In this way, portions of the horizontal transfer electrodes 42 between which a large distance is provided increase, which can further reduce the interphase capacitance.

Figure 12:
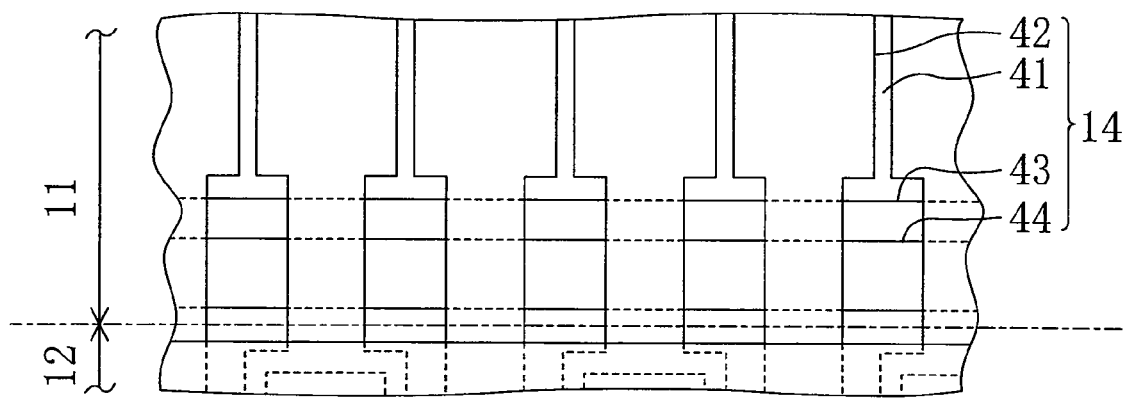
FIG. 12 is a plan view showing a variation of the example solid-state image sensing device.

In order not to reduce the charge transfer efficiency, the distance between the horizontal transfer electrodes 42 is preferably small over the horizontal channel region 41. However, as shown in FIG. 12, as long as the distance between the horizontal transfer electrodes 42 is sufficiently small at least in the middle of the horizontal channel region 41, no problem is found even if the distance between the horizontal transfer electrodes 42 is large in a part of the horizontal channel region 41 close to the device isolation region 12.

The larger the width of an electrode is, the deeper potential formed below the electrode is. If the distance between the horizontal transfer electrodes 42 is larger in an end than in the middle of the horizontal channel region 41, the width of the horizontal transfer electrodes 42 is larger over the middle than over the end of the horizontal channel region 41. Therefore, the potential is deeper in the middle than in the end of the horizontal channel region 41. Therefore, signal charges collect mainly to the middle of the horizontal channel region 41, so that the signal charges are transferred at the middle of the horizontal channel region 41 even if the width of the horizontal transfer electrodes 42 is small over the end of the horizontal channel region 41. However, if the width of end portions of the horizontal transfer electrodes 42 close to the vertical transfer electrode 32 is small, the reception efficiency of the charges from the vertical transfer sections 13 reduces. Therefore, it is preferable that the width of the end portions of the horizontal transfer electrodes 42 close to the vertical transfer electrodes 32 is the same as that of portions of the horizontal transfer electrodes 42 over the middle of the horizontal channel region 41.

Figure 13:
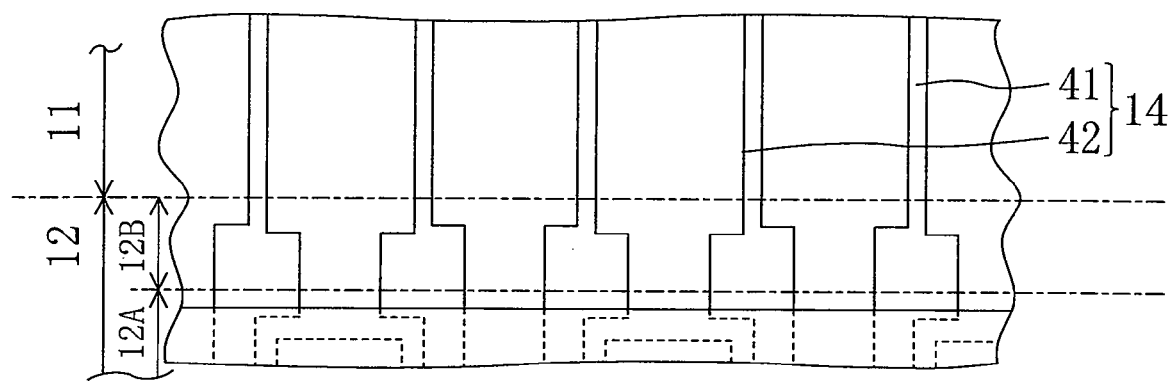
FIG. 13 is a plan view showing a variation of the example solid-state image sensing device.

In the present embodiment, an example is shown in which the device isolation region 12 is formed by a LOCOS oxide film. However, as shown in FIG. 13, a configuration may be possible in which the device isolation region 12 includes an impurity implanted region 12B and a LOCOS oxide film region 12A. In this case, impurities for shallowing potential may be implanted into the impurity implanted region 12B, and if the horizontal channel region is n-type, p-type impurities may be implanted into the impurity implanted region 12B. In this way, the horizontal barrier region 43 and the horizontal drain region 44 may be omitted. It may be required only that the distance between the horizontal transfer electrodes 42 is large at a boundary between the impurity implanted region 12B and the LOCOS oxide film region 12A. Therefore, the width of the horizontal transfer electrodes 42 may be changed at their portions formed over the impurity implanted region 12B.

Moreover, in the present embodiment, the width of the horizontal transfer electrodes 42 is large at their connection portions to the contacts 52 for connecting the horizontal transfer electrodes 42 to the horizontal bus lines 51. As shown in FIG. 2, an upper surface of the LOCOS oxide film is substantially flat excepting the boundary between the device formation region 11 and the device isolation region 12. Therefore, even if the width of the horizontal transfer electrodes 42 is large and thus the distance between the horizontal transfer electrodes 42 is small at the connection portions to the contacts 52, there is almost no possibility that underetching occurs. However, if an area for connection to the contacts 52 is sufficiently ensured, it is not necessary to increase the width of the horizontal transfer electrodes 42 again over the device formation region 11.

Descriptions are given of the case where the device isolation region 12 has a LOCOS structure. However, also in the case where the device isolation region 12 is a Shallow Trench Isolation (STI), a level-difference portion is formed at a boundary between a device formation region and a device isolation region, so that substantially the same effects are obtained.

In the present embodiment, a solid-state image sensing device whose transfer type is interline transfer (IT) type is described as an example. However, also in a solid-state image sensing device of frame transfer (FT) type or frame interline transfer (FIT) type, substantially the same effects are obtained. Moreover, the horizontal transfer section of the present embodiment is operated by two-phase driving, but the horizontal transfer section may be operated by three-phase driving or more-than-three-phase driving. The vertical transfer section also may be operated by more-than-three-phase driving.

It should be noted that if the vertical transfer electrode is also required to extend over the device formation region and the device isolation region, the vertical transfer electrode may be formed to have substantially the same configuration as that of the horizontal electrode.

As described above, the example solid-state image sensing device and the method for fabricating the same can realize a solid-state image sensing device which less likely causes a short between horizontal transfer electrodes and has an increased charge transfer efficiency, and are useful especially as a solid-state image sensing device of Charge Coupled Device (CCD) type and a method for fabricating the same.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A solid-state image sensing device comprising:
   a plurality of light receiving elements arranged in a matrix in a device formation region surrounded by a device isolation region of a semiconductor substrate;
   a plurality of vertical transfer sections for transferring charges of the light receiving elements in a column direction; and
   a horizontal transfer section having a horizontal channel region and a plurality of horizontal transfer electrodes extending over the horizontal channel region and the device isolation region and being spaced apart from each other, the horizontal transfer section receiving the charges from the vertical transfer sections and transferring the received charges in a row direction, wherein
   a distance between the horizontal transfer electrodes is larger at a boundary between the device formation region and the device isolation region than in the middle of the horizontal channel region.

2. The solid-state image sensing device of claim 1, wherein the distance between the horizontal transfer electrodes is equal in the middle of the horizontal channel region and in an end of the horizontal channel region close to the vertical transfer sections.

3. The solid-state image sensing device of claim 1, wherein the horizontal transfer section includes a horizontal barrier region and a horizontal drain region between the horizontal channel region and the device isolation region, and
   the distance between the horizontal transfer electrodes changes over the horizontal drain region.

4. The solid-state image sensing device of claim 1, wherein the horizontal transfer section includes a horizontal barrier region and a horizontal drain region between the horizontal channel region and the device isolation region, and
   the distance between the horizontal transfer electrodes changes over the horizontal barrier region.

5. The solid-state image sensing device of claim 1, wherein the distance between the horizontal transfer electrodes changes over the horizontal channel region.

6. The solid-state image sensing device of claim 1, wherein the device isolation region includes an oxide film region and an impurity implanted region between the oxide film region and the device formation region, and
   the distance between the horizontal transfer electrodes changes over the impurity implanted region.

7. The solid-state image sensing device of claim 1, further comprising:
   a bus line for applying a control voltage to the horizontal transfer electrodes; and
   contacts to connect the bus line and the horizontal transfer electrodes, wherein
   the contacts are connected to portions of the horizontal transfer electrodes over the device isolation region.

8. The solid-state image sensing device of claim 7, wherein the portions of the horizontal transfer electrodes connected by the contacts are larger in width than portions of the horizontal transfer electrodes at the boundary between the device formation region and the device isolation region.

9. A method for fabricating a solid-state image sensing device comprising:
   (a) forming a horizontal channel region in a device formation region surrounded by a device isolation region of a semiconductor substrate;
   (b) forming a conductive film extending over the horizontal channel region and the device isolation region;
   (c) forming a first mask having openings on the conductive film, the openings extending in a direction crossing the horizontal channel region, and a width of the openings being larger at a boundary between the device formation region and the device isolation region than in the middle of the horizontal channel region; and
   (e) removing portions of the conductive film exposed in the openings to form a plurality of horizontal transfer electrodes, a distance between the horizontal transfer electrodes being larger at the boundary between the device formation region and the device isolation region than in the middle of the horizontal channel region.

10. The method of claim 9, wherein at (c), sidewalls are formed on side faces of the openings.

11. The method of claim 9, wherein (c) includes:
    (c1) forming an insulating film having first openings of constant width over the conductive film;
    (c2) forming sidewalls on side faces of the first openings;
    (c3) after (c2), forming a second mask having second openings over the insulating film, the second openings exposing the insulating film at the boundary between the device formation region and the device isolation region, and a width of the second openings being larger than the width of the first openings; and
    (c4) removing portions of the insulating film exposed in the second mask to increase the width of the first openings such that the width of the first openings is larger at the boundary between the device formation region and the device isolation region than in other parts of the device formation region and the device isolation region.

* * * * *